US011502088B2

(12) United States Patent
Lee et al.

(10) Patent No.: US 11,502,088 B2
(45) Date of Patent: Nov. 15, 2022

(54) LAYOUT PATTERN OF STATIC RANDOM ACCESS MEMORY AND THE MANUFACTURING METHOD THEREOF

(71) Applicant: UNITED MICROELECTRONICS CORP., Hsin-Chu (TW)

(72) Inventors: Wei-Chi Lee, Tainan (TW); Shu-Wei Yeh, Taichung (TW); Chang-Hung Chen, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 76 days.

(21) Appl. No.: 17/163,571

(22) Filed: Feb. 1, 2021

(65) Prior Publication Data

US 2022/0216220 A1 Jul. 7, 2022

(30) Foreign Application Priority Data

Jan. 6, 2021 (CN) .......................... 202110011339.1

(51) Int. Cl.
*H01L 27/11* (2006.01)
*H01L 21/8238* (2006.01)
*H01L 27/092* (2006.01)

(52) U.S. Cl.
CPC .. *H01L 27/1104* (2013.01); *H01L 21/823821* (2013.01); *H01L 27/0924* (2013.01)

(58) Field of Classification Search
CPC ......... H01L 27/1104; H01L 21/823821; H01L 27/0924
See application file for complete search history.

(56) References Cited

U.S. PATENT DOCUMENTS

| 8,315,084 | B2 | 11/2012 | Liaw | |
|---|---|---|---|---|
| 8,675,397 | B2 | 3/2014 | Liaw | |
| 9,892,781 | B2 | 2/2018 | Liaw | |
| 2011/0222332 | A1* | 9/2011 | Liaw | ..................... G11C 11/413 365/156 |
| 2013/0258759 | A1 | 10/2013 | Liaw | |
| 2014/0306296 | A1 | 10/2014 | Jeon | |
| 2017/0110182 | A1 | 4/2017 | Liaw | |
| 2017/0243861 | A1* | 8/2017 | Wang | .................. H01L 27/0207 |
| 2020/0027869 | A1 | 1/2020 | Yeh | |

* cited by examiner

*Primary Examiner* — Karen Kusumakar
*Assistant Examiner* — Adam S Bowen
(74) *Attorney, Agent, or Firm* — Winston Hsu

(57) ABSTRACT

A layout pattern of static random access memory at least includes a substrate, a plurality of fin structures on the substrate, a plurality of gate structures on the substrate and spanning the fin structures to form a plurality of transistors distributed on the substrate, the plurality of transistors include, a first pull-up transistor PU1, a first pull-down transistor PD1, a second pull-up transistor PU2, a second pull-down transistor PD2, a first pass gate transistor PG1, a second pass gate transistor PG2, a first read transistor RPD and a second read transistor RPG, and an additional fin structure, the additional fin structure is located between the fin structure of the first pass gate transistor PG1 and the fin structure of the second read transistor RPG.

19 Claims, 6 Drawing Sheets

LAYOUT PATTERN OF STATIC RANDOM ACCESS MEMORY AND THE MANUFACTURING METHOD THEREOF

BACKGROUND OF THE INVENTION

1. Field of the Invention

The invention relates to a static random access memory (SRAM), and in particular to a layout pattern of static random access memory (SRAM) with the effect of reducing current difference.

2. Description of the Prior Art

An embedded static random access memory (SRAM) comprises a logic circuit and a static random access memory connected to the logic circuit. SRAM is a kind of volatile memory cell, which means it preserves data only while power is continuously applied. SRAM is built of cross-coupled inverters that store data during the time that power remains applied, unlike dynamic random access memory (DRAM) that needs to be periodically refreshed. Because of its high access speed, SRAM is also used in computer systems as a cache memory.

SUMMARY OF THE INVENTION

The present invention provides a layout pattern of static random access memory, it includes a substrate, a plurality of fin structures located on the substrate, a plurality of gate structures located on the substrate and span the fin structures to form a plurality of transistors on the substrate, each transistor comprises a part of the gate structure spanning a part of the fin structure, and the plurality of transistors includes a first pull-up transistor (PU1), a first pull-down transistor (PD1), a second pull-up transistor (PU2) and a second pull-down transistor (PD2) together constituting a latch circuit, a first pass gate transistor (PG1) and a second pass gate transistor (PG2) connected to the latch circuit, and a first read transistor (RPD) and a second read transistor (RPG) connected in series with each other, the gate structure of the first read transistor (RPD) is connected with the gate structure of the first pull-down transistor (PD1), and an additional fin structure located between the fin structure of the first pass gate transistor (PG1) and the fin structure of the second read transistor (RPG).

The present invention provides a forming method of layout pattern of static random access memory, the method includes: providing a substrate, forming a plurality of fin structures located on the substrate, forming a plurality of gate structures located on the substrate and span the fin structures to form a plurality of transistors on the substrate, each transistor comprises a part of the gate structure spanning a part of the fin structure, and the plurality of transistors including: a first pull-up transistor (PU1), a first pull-down transistor (PD1), a second pull-up transistor (PU2) and a second pull-down transistor (PD2) together constituting a latch circuit, a first pass gate transistor (PG1) and a second pass gate transistor (PG2) connected to the latch circuit, and a first read transistor (RPD) and a second read transistor (RPG) connected in series with each other, the gate structure of the first read transistor (RPD) is connected with the gate structure of the first pull-down transistor (PD1), and forming an additional fin structure located between the fin structure of the first pass gate transistor (PG1) and the fin structure of the second read transistor (RPG).

The present invention provides a layout pattern of static random access memory, it includes a substrate, a plurality of fin structures located on the substrate, a plurality of gate structures located on the substrate and span the fin structures to form a plurality of transistors distributed on the substrate, each transistor comprises a part of the gate structure spanning a part of the fin structure, and the plurality of transistors includes a first pull-up transistor (PU1), a first pull-down transistor (PD1), a second pull-up transistor (PU2) and a second pull-down transistor (PD2) together constituting a latch circuit, a first pass gate transistor (PG1A), a second pass gate transistor (PG1B), a third pass gate transistor (PG2A) and a fourth pass gate transistor (PG2B) connected to the latch circuit, the fin structures included in the first pull-down transistor (PD1), there is at least one extended fin structure, the distance from the fin structure of the first pass gate transistor (PG1A) to the extended fin structure is equal to the distance from the fin structure of the second pass gate transistor (PG1B) to the extended fin structure.

One feature of the present invention is that by forming an additional fin structure or an extended fin structure, to reduce the problem that the insulation layer around a specific transistor is too large (i.e., the surrounding area is empty) and leading more stress. With the method provided by the invention, the symmetry of devices can be improved, and the current difference between different transistors can be effectively reduced, so as to improve the quality of SRAM.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and the effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Figure 1:
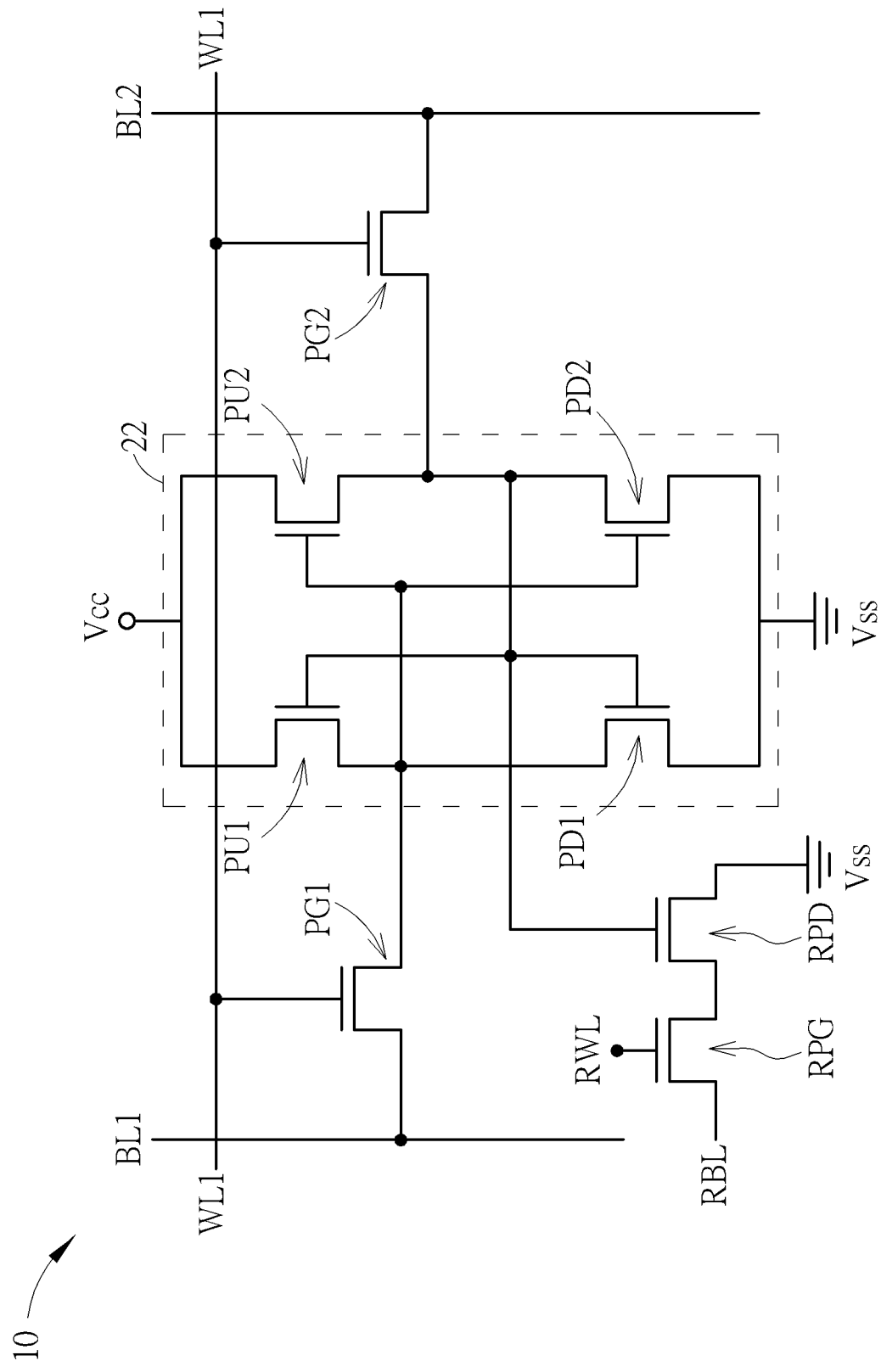
FIG. 1 is a circuit diagram of a bank of SRAM memory cells according to the first embodiment of the present invention.
Figure 2:
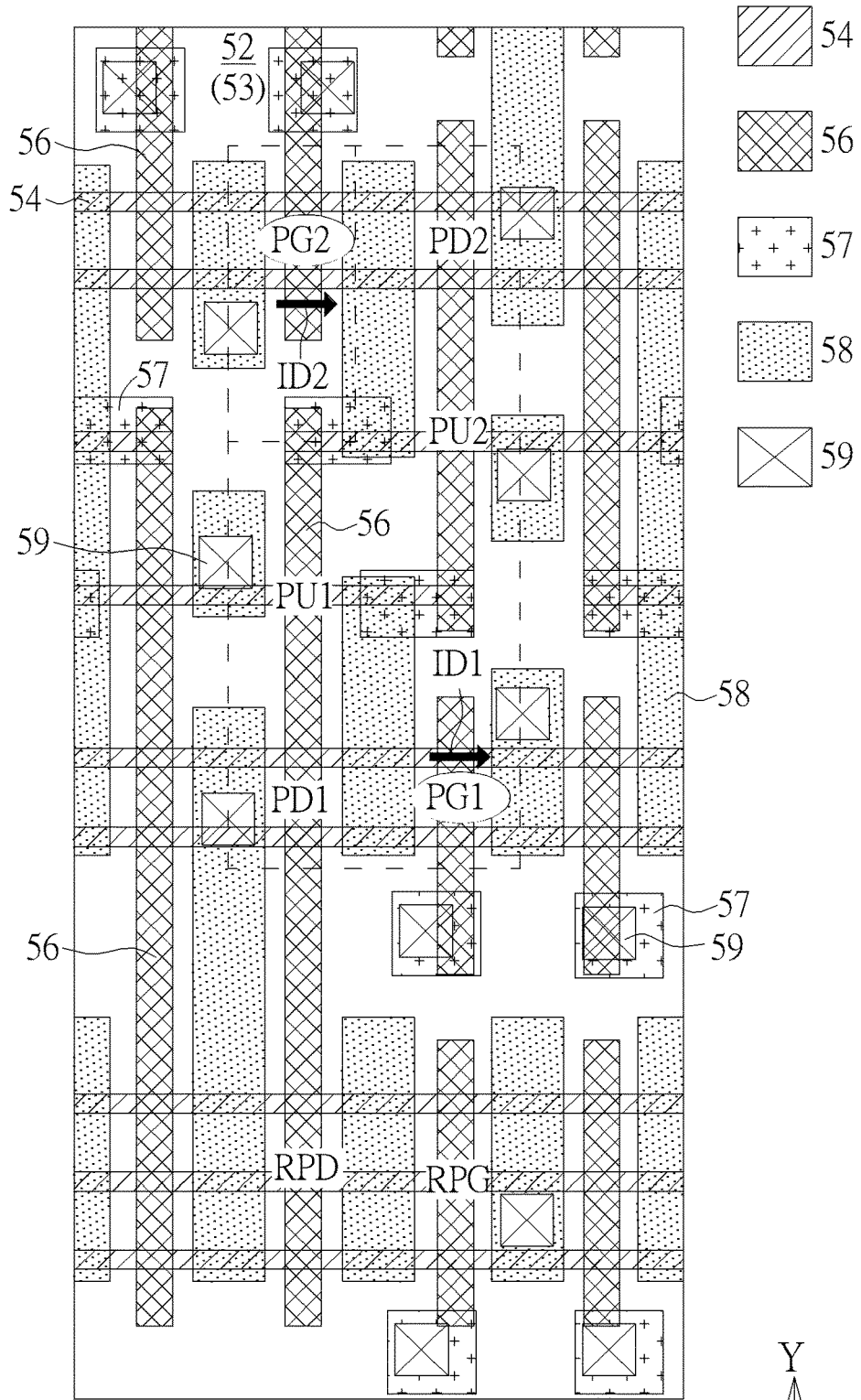
FIG. 2 is a layout diagram of a static random access memory according to the first preferred embodiment of the present invention.

Please refer to FIGS. 1-2 FIG. 1 illustrates a circuit diagram of a SRAM cell according to a first preferred embodiment of the present invention, and FIG. 2 illustrates a layout diagram of a SRAM according to a first preferred embodiment of the present invention.

In this embodiment, an 8TRF-SRAM cell 10 includes a first pull-up transistor PU1, a second pull-up transistor PU2, a first pull-down transistor PD1 and a second pull-down transistor PD2, a first pass gate transistor PG1 and a second pass gate transistor PG2. In addition, the 8TRF-SRAM cell 10 further comprises two read transistors: RPG and RPD which are series connected to each other. The first pull-up transistor PU1, the second pull-up transistor PU2, the first pull-down transistor PD1 and the second pull-down transistor PD2 constitute a latch circuit 22. Besides, in this embodiment, the first pull-up transistor PU1 and the second pull-up transistor PU2 share a source/drain region and electrically connect to a voltage source Vcc, and the first and the second pull-down transistors PD1 and PD2 share a source/drain region and electrically connect to a voltage source Vss.

Furthermore, the gates of the first pass gate transistor PG1 and the second pass gate transistor PG2 are respectively coupled to a word line (WL1); the source of the first pass gate transistor PG1 is coupled to a first bit line (BL1), the source of the second pass gate transistor PG2 is coupled to a second bit line (BL2); the source of the read transistor RPG is coupled to a read bit line (RBL), the gate of the read transistor RPD is coupled to the latch circuit 22, and the drain of the read transistor RPD is coupled to the voltage source Vss.

In this embodiment, as shown in FIG. 2, the 8TRF-SRAM cell 10 is disposed on a substrate 52, such as a silicon substrate or silicon-on-insulator (SOI) substrate. The substrate may be a planar substrate, or a plurality of fin structures 54 may be formed on the substrate 52. Next, pluralities of gate structures 56 are formed on the substrate 52. In this embodiment, take an 8T-SRAM with fin structures 54 as an example, but the present invention is not limited thereto. In another case, the planar SRAM (the SRAM without comprising fin structures) may also be comprised within the scope of the present invention. Besides, in this embodiment, a plurality of contact structures 57, 58 are disposed on the substrate 52, and a plurality of contact plugs 59 which is electrically connected to the contact structures 57, 58. The other structure features and the operation principle of 8TRF-SRAM are well known to those skilled in the art, and will not be redundantly described here.

In the layout pattern of the present invention, a three-dimensional SRAM is taken as an example (that is, a fin structure 54 is formed to replace a planar doped region). As shown in FIG. 2, the substrate 52 is covered with an insulating layer 53, such as a shallow trench isolation structure (STI), except for the fin structure 54, the gate structure 56, the connection structure 57, the connection structure 58 and the contact plugs 59, so as to isolate the electronic components (such as transistors) from short circuit. In addition, each gate structure 56 spans part of the fin structure 54 to form transistors (such as the first pull-up transistor PU1, the second pull-up transistor PU2, the first pull-down transistor PD1, the second pull-down transistor PD2, the first pass gate transistor PG1, the second pass gate transistor PG2, the read transistor RPG and the read transistor RPD). For the sake of clarity of the drawing, the positions of the above transistors are directly marked on FIG. 2, especially at the intersection of the gate structure 56 and the fin structure 54.

The applicant found that during the operation of SRAM, an issue may arise due to different layout designs or other reasons such as energy loss: the current value passing through the first pass gate transistor PG1 (i.e., the current flowing from the source to the drain, marked as ID1) is inconsistent with the current value passing through the second pass gate transistor PG2 (i.e., the current flowing from the source to the drain, marked as ID2). Taking 28 nm 8TDP-SRAM as an example, according to the applicant's experimental results, the current value ID1 through the first pass gate transistor PG1 is about 7%-13% smaller than the current value ID2 through the second pass gate transistor PG2.

One of the reasons for the current inconsistency is that the periphery of each transistor is surrounded by the insulating layer 53, and the insulating layer 53 certain stress. The applicant found that if the periphery of a certain transistor is relatively empty, that is, there are few components around it, the transistor will also bear more stress due to the large area of the surrounding insulating layer 53. Taking the embodiment shown in FIG. 2 as an example, since the reading transistor RPD needs to be connected below the first pull-down transistor PD1 (in the negative Y direction), the surrounding open area is larger (especially in the area close to the negative Y direction), so as to reserve enough device formation area. Since the gate structure 56 is connected between the first pull-down transistor PD1 and the read-out transistor RPD, there are elements, so that the insulating layer 53 will not cause obvious stress to the first pull-down transistor PD1 and the read-out transistor RPD. However, since the gate structure 56 of the first pass gate transistor PG1 parallel to the first pull-down transistor PD1 in the X direction is not connected to the gate structure 56 of the read transistor RPG, the open area around the first pass gate transistor PG1 is larger, that is, the area surrounded by the insulating layer 53 of the first pass gate transistor PG1 is larger than that of the second pass gate transistor PG2. As a result, the stress of the first pass gate transistor PG1 and the second pass gate transistor PG2 are different, which further affects the current value and may cause inconsistent currents of SRAM devices.

Figure 3:
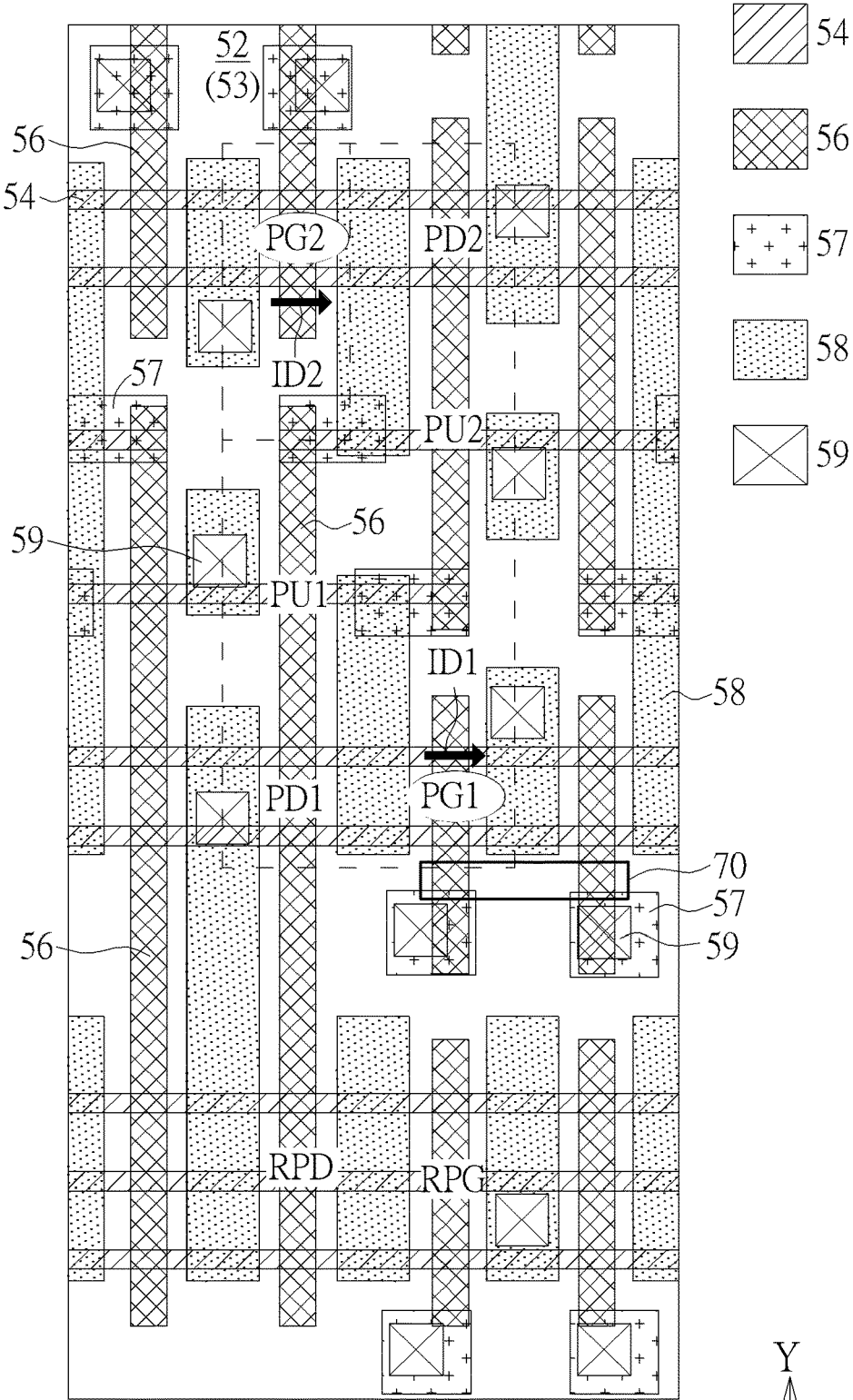
FIG. 3 is a layout diagram of a static random access memory according to a second preferred embodiment of the present invention.

In order to solve the above issues, the present invention proposes an improved scheme, which uses the additional fin structure to avoid more stress caused by the excessive area of the insulating layer around a specific transistor. Please refer to FIG. 3 for details. FIG. 3 is a layout diagram of a static random access memory according to a second preferred embodiment of the present invention. The difference between this embodiment and the layout pattern shown in FIG. 2 is that an additional fin structure 70 is additionally formed between the first pass gate transistor PG1 and the read transistor RPG. The additional fin structure 70 is different from the fin structure 54 described above. The fin structure 54 described above is a continuous structure (that is, the fin structure 54 is not obviously cut off from the figure), but the additional fin structure 70 is a segmented structure. The additional fin structure 70 is formed around the first pass gate transistor PG1, which can block the stress caused by part of the insulating layer 53, and then adjust the open area around the first pass gate transistor PG1 to be close to the open area around the second pass gate transistor PG2.

In this embodiment, the fin structure 54 included in the first pass gate transistor PG1 and the fin structure 54 included in the read transistor RPG are both continuous structures, and the additional fin structure 70 is a segmented structure. Furthermore, the additional fin structure 70 and each fin structure 54 are arranged parallel to each other (for example, they are all arranged along the X axis).

In addition, in this embodiment, the additional fin structure 70 partially overlaps with the gate structure 56 of the first pass gate transistor PG1, but the additional fin structure 70 does not overlap with the gate structure of the read transistor RPG.

In this embodiment, a plurality of patterned metal layers (i.e., the contact structures 57, the contact structures 58 and the contact plugs 59) are included, and spanning each fin structure 54.

In this embodiment, by forming an additional fin structure, the insulating layer area around a specific transistor (that is, the surrounding open area) is reduced, thereby reducing the stress borne by the transistor. With the method provided by the invention, the symmetry of devices can be improved, and the current gap between different transistors can be effectively reduced, so as to improve the quality of SRAM.

Hereinafter, different embodiments of the SRAM layout pattern and its manufacturing method of the present invention will be described. To simplify the description, the following description mainly focuses on the differences of each embodiment, and the similarities will not be repeated. In addition, the same elements in each embodiment of the present invention are labeled with the same reference numerals, which is convenient for comparison among the embodiments.

Figure 4:
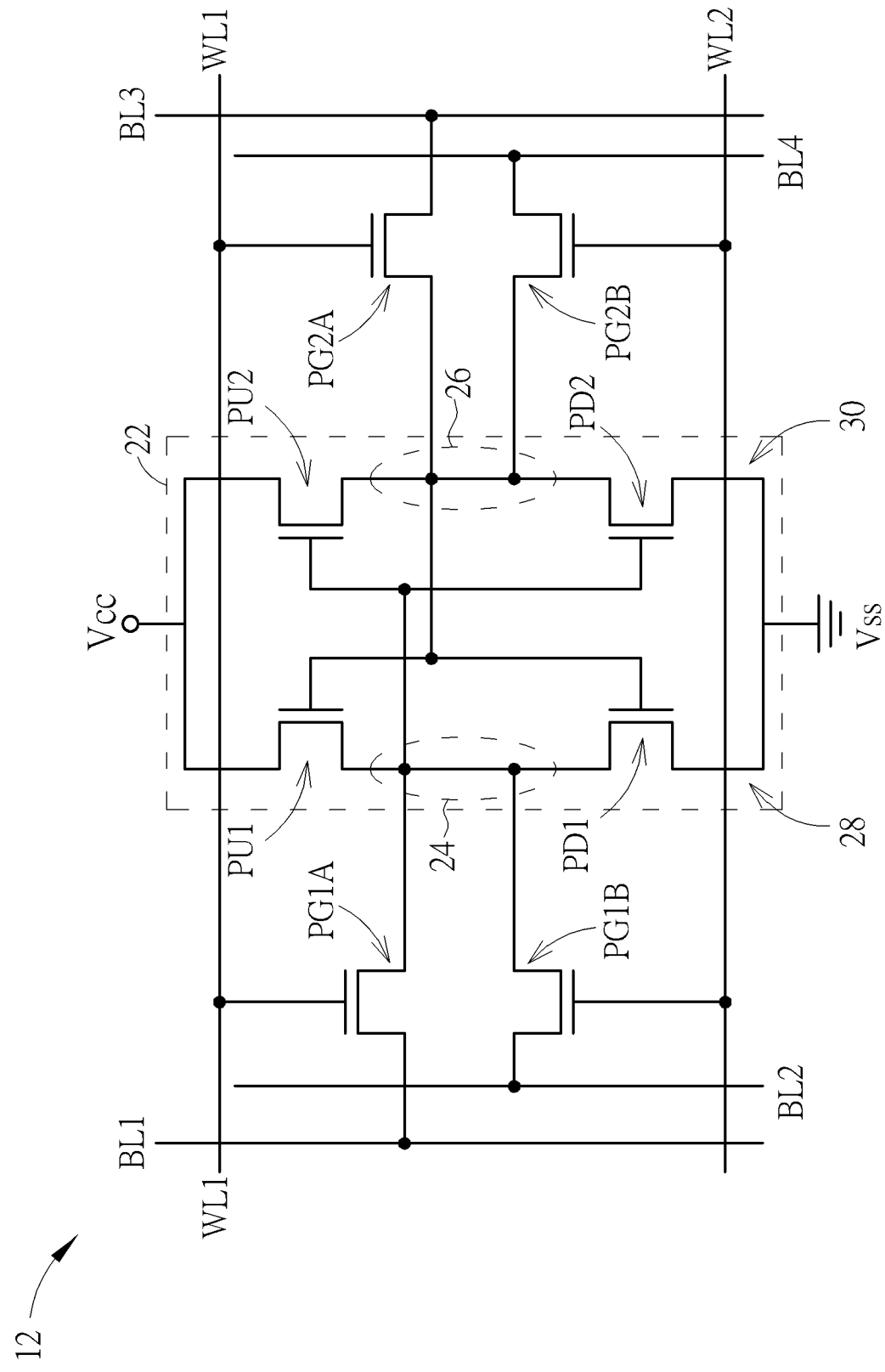
FIG. 4 is a circuit diagram of a group of eight-transistor dual port SRAM (8TDP-SRAM) memory cells in the SRAM of the present invention.
Figure 5:
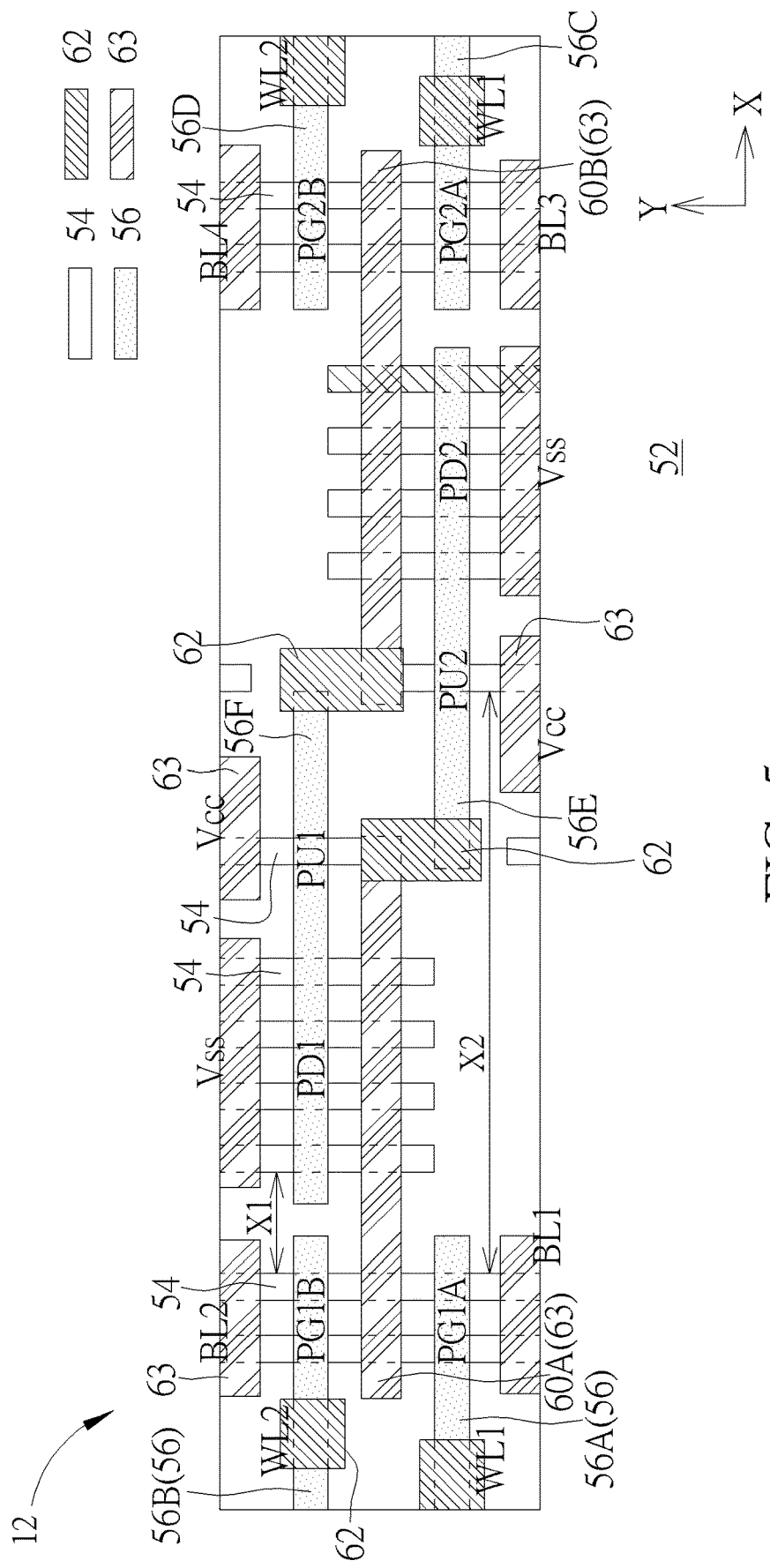
FIG. 5 is a layout diagram of a static random access memory according to a third preferred embodiment of the present invention.

The above concept proposed by the present invention can also be applied to SRAM layout patterns of other shapes. E.g., eight-transistor dual port SRAM (8TDP-SRAM). As shown below:

Referring to FIGS. 4-5, FIG. 4 illustrates a circuit diagram of an eight-transistor SRAM (8T-SRAM) cell according to a third preferred embodiment of the present invention, and FIG. 5 illustrates a layout diagram of an 8T-SRAM according to the third preferred embodiment of the present invention.

As shown in FIGS. 4-5, the SRAM device of the present invention preferably includes at least one SRAM cell, each SRAM cell including an eight-transistor dual port SRAM (8TDP-SRAM) cell 12.

In this embodiment, each 8TDP-SRAM cell 12 is composed of a first pull-up transistor PU1, a second pull-up transistor PU2, and a first pull-down transistor PD1, a second pull-down transistor PD2, a first pass gate transistor PG1A, a second pass gate transistor PG1B, a third pass gate transistor PG2A and a fourth pass gate transistor PG2B. These eight transistors constitute a set of flip-flops. The first and the second pull-up transistors PU1 and PU2, and the first and the second pull-down transistors PD1 and PD2 constitute a latch circuit 22 that stores data in the storage nodes 24 and 26. Since the first and the second pull-up transistors PU1 and PU2 act as power load devices, they can be replaced by resistors. Under this circumstance, the static random access memory becomes a four-transistor SRAM (4T-SRAM). In this embodiment, the first and the second pull-up transistors PU1 and PU2 preferably share a source/drain region and electrically connect to a voltage source (voltage node) Vcc, and the first and the second pull-down transistors PD1 and PD2 share a source/drain region and electrically connect to a voltage source (voltage node) Vss.

Preferably, the first and the second pull-up transistors PU1 and PU2 of the 8TDP-SRAM cell 12 are composed of p-type metal oxide semiconductor (PMOS) transistors; the first and the second pull-down transistors PD1 and PD2, the first pass gate transistors PG1A, the second pass gate transistors PG1B, the third pass gate transistors PG2A and the fourth pass gate transistors PG2B composed of n-type metal oxide semiconductor (NMOS) transistors, but not limited thereto. The first pull-up transistor PU1 and the first pull-down transistor PD1 constitute an inverter, which further form a series circuit 28. One end of the series circuit 28 is connected to a voltage source Vcc and the other end of the series circuit 28 is connected to a voltage source Vss. Similarly, the second pull-up transistor PU2 and the second pull-down transistor PD2 constitute another inverter and a series circuit 30. One end of the series circuit 30 is connected to the voltage source Vcc and the other end of the series circuit 30 is connected to the voltage source Vss. Each pass gate transistors (including the first pass gate transistor PG1A, the second pass gate transistor PG1B, the third pass gate transistor PG2A and the fourth pass gate transistor PG2B) configured with the two cross-coupled inverters respectively, wherein each of the at least one pull-up transistor (PUs), the at least one pull-down transistors (PDs), and the at least two pass gate transistor (PGs) includes a fin field-effect transistor (FinFET).

The storage node 24 is connected to the respective gates of the second pull-down transistor PD2 and the second pull-up transistor PU2. The storage node 24 is also connected to the drain of the first pull-down transistor PD1, the drain of the first pull-up transistor PU1, the drain of the first pass gate transistor PG1A and the drain of the second pass gate transistor PG1B. Similarly, the storage node 26 is connected to the respective gates of the first pull-down transistor PD1 and first the pull-up transistor PU1. The storage node 26 is also connected to the drain of the second pull-down transistor PD2, the drain of the second pull-up transistor PU2, the drain of the third pass gate transistor PG2A and the drain of the fourth pass gate transistor PG2B. The gates of the first pass gate transistor PG1A and the third pass gate transistor PG1B are respectively coupled to a first word line (WL1); the gates of the second pass gate transistor PG1B and the fourth pass gate transistor PG2B are respectively coupled to a second word line (WL2); the source of the first pass gate transistor PG1A is coupled to a first bit line (BL1); the source of the second pass gate transistor PG1B is coupled to a second bit line (BL2); the source of the third pass gate transistor PG2A is coupled to a third bit line (BL3); and the source of the fourth pass gate transistor PG2B is coupled to a fourth bit line (BL4).

Please refer to FIG. 5, in this embodiment, the 8TDP-SRAM cell 12 is disposed on a substrate 52, such as a silicon substrate or silicon-on-insulator (SOI) substrate. A plurality of fin structures 54 may be formed on the substrate 52. The fin structures are arranged parallel with each other. In addition, a shallow trench isolation (STI, not shown) is disposed between each fin structure 54.

In addition, a plurality of gate structures 56 are formed on the substrate 52. Each transistor (including the first pull-up transistor PU1, the first pull-down transistor PD1, the second pull-up transistor PU2, the second pull-down transistor PD2, the first pass gate transistor PG1A, the second pass gate transistor PG1B, the third pass gate transistor PG2A, and the fourth pass gate transistor PG2B mentioned above) comprises a gate structure 56 crossing over at least one fin structure 54, to form the transistors.

As shown in FIG. 5, in order to clearly define the position of each gate structure 56, the gate structure 56 is labeled to a first gate structure 56A, a second gate structure 56B, a third gate structure 56C, a fourth gate structure 56D, a fifth gate structure 56E and a sixth gate structure 56F. The first gate structure 56A crosses over the fin structure 54 to form the first pass gate transistor PG1A; the second gate structure 56B crosses over the fin structure 56B to form the second pass gate transistor PG1B; the third gate structure 56C crosses over the fin structure 54 to form the third pass gate transistor PG2A; the fourth gate structure 56D crosses over the fin structure 54 to form the fourth pass gate transistor PG2B; the fifth gate structure 56E crosses over at least two fin structures 54, to form the second pull-up transistor PU2 and the second pull-down transistor PD2; the sixth gate structure 56F crosses over at least two fin structures 54, to form the first pull-up transistor PU1 and the first pull-down transistor PD1. It is to be understood that all of the first gate structure 56A to the sixth gate structure 56F belong to the gate structure 56.

In the present invention, each gate structure 56 is arranged in a first direction (e.g., an X-axis), and each fin structure 54 is arranged in a second direction (e.g., Y-axis). Preferably, the first direction and the second direction are perpendicular to each other.

The present invention further comprises a first local interconnection layer 60A and a second local interconnection layer 60B arranged in a first direction. The first local interconnection layer 60A crosses over the fin structure 54 of the first pull-up transistor PU1, the fin structure 54 of the first pull-down transistor PD1, the fin structure 54 of the first pass gate transistor PG1A and the fin structure 54 of the second pass gate transistor PG1B. The second local interconnection layer 60B crosses the fin structure 54 of the second pull-up transistor PU2, the fin structure 54 of the second pull-down transistor PD2, the fin structure 54 of the third pass gate transistor PG2A, and the fin structure 54 of the fourth pass gate transistor PG2B.

In addition, a plurality of contact plugs 62 and a plurality of contact layers 63 are formed on the substrate 52, the contact plugs 62 and the contact layers 63 are used to connect different transistors (e.g., a gate of the second pull-up transistor PU2 and drain of the first pull-down transistor PU1 are connected to each other through the contact plug 62 and the contact layer 63), or used to connect the transistors to other elements (e.g., a source of the first pull-up transistor PU1 is connected to the voltage source Vcc). In FIG. 2, the elements that connected to each contact plug or each contact layer (for example, the voltage source Vcc, the voltage source Vss, the first word line WL1, the second word line WL2, the first bit line BL1, the second bit line BL2, the third bit line BL3, and the fourth bit line BL4) are labeled on each contact plug 62 or each contact layer 63 directly, to clearly represent the corresponding elements of the contact plugs 62 and the contact layers 63.

In this embodiment, a first pull-down transistor PD1 is formed beside the second pass gate transistor PG1B (right side, positive X direction), but no transistor is formed on the right side of the first pass gate transistor PG1A. Therefore, the distance between the fin structure 54 included in the second pass gate transistor PG1B and the adjacent fin structure (distance X1 in FIG. 5) is different from that between the fin structure 54 included in the first pass gate transistor PG1A and the adjacent fin structure (distance X2 in FIG. 5), resulting in uneven stress borne by the above transistors.

Therefore, the above improvement scheme can be applied to this embodiment. Please refer to FIG. 6, which is a layout diagram of a static random access memory according to a fourth preferred embodiment of the present invention. In this embodiment, part of the fin structure can be extended, that is, an extended fin structure 72 is used to replace part of the fin structure 54 included in the first pull-down transistor PD1. Therefore, the distance between the fin structure 54 included in the second pass gate transistor PG1B and the adjacent extended fin structure 72 (distance X1' in FIG. 6) is equal to that between the fin structure 54 included in the first pass gate transistor PG1A and the adjacent extended fin structure 72 (distance X2' in FIG. 6), which can avoid the problem of uneven stress borne by the above transistors and improving the quality of SRAM.

Figure 6:
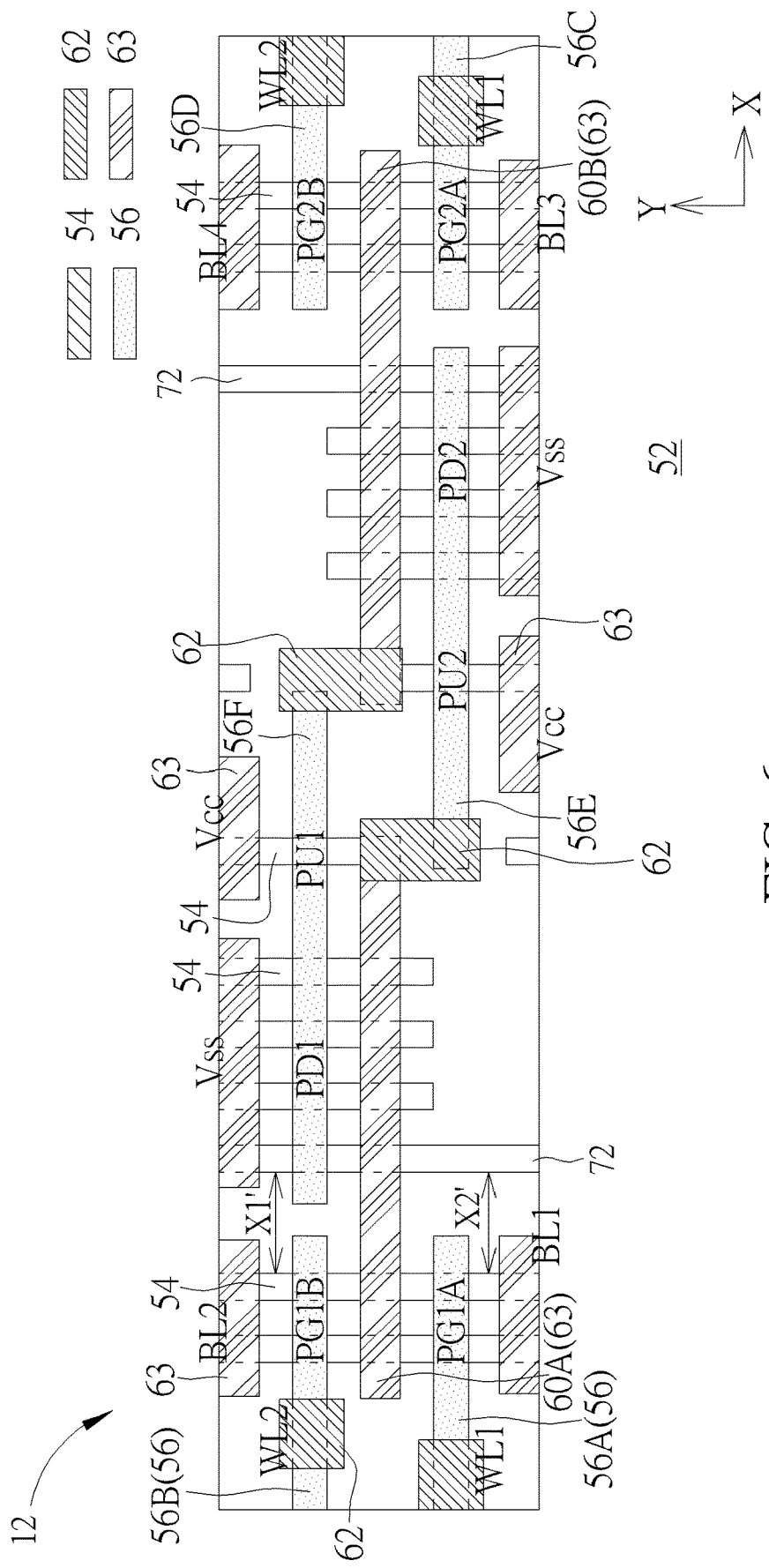
FIG. 6 is a layout diagram of a static random access memory according to a fourth preferred embodiment of the present invention.

It is worth noting that, as shown in FIG. 6, the fin structure of the second pull-down transistor PD2 can also be replaced by an extended fin structure 72, so that the current passing through the third pass gate transistor PG2A and the current passing through the fourth pass gate transistor PG2B are close to the same, and the concept is the same as the above, which is not repeated here.

It should be noted that for a single transistor (such as the first pull-down transistor PD1 or the second pull-down transistor PD2), the layout pattern in this embodiment includes two fin structures with different lengths, including the fin structure 54 and the extended fin structure 72, and the length of the extended fin structure 72 is larger than that of the fin structure 54.

To sum up, one feature of the present invention is that by forming an additional fin structure or an extended fin structure, to reduce the problem that the insulation layer around a specific transistor is too large (i.e., the surrounding area is empty) and leading more stress. With the method provided by the invention, the symmetry of devices can be improved, and the current difference between different transistors can be effectively reduced, so as to improve the quality of SRAM.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A layout pattern of static random access memory, comprising:
    a substrate;
    a plurality of fin structures located on the substrate;
    a plurality of gate structures located on the substrate and span the fin structures to form a plurality of transistors on the substrate, wherein each transistor comprises a part of the gate structure spanning a part of the fin structure, and the plurality of transistors comprising:
        a first pull-up transistor (PU1), a first pull-down transistor (PD1), a second pull-up transistor (PU2) and a second pull-down transistor (PD2) together constituting a latch circuit;
        a first pass gate transistor (PG1) and a second pass gate transistor (PG2) connected to the latch circuit; and
        a first read transistor (RPD) and a second read transistor (RPG) connected in series with each other, wherein the gate structure of the first read transistor (RPD) is connected with the gate structure of the first pull-down transistor (PD1); and
    an additional fin structure located between the fin structure of the first pass gate transistor (PG1) and the fin structure of the second read transistor (RPG), wherein a length of the additional fin structure is shorter than a length of the fin structure.

2. The layout pattern according to claim 1, wherein the fin structure of the first pass gate transistor (PG1) and the fin structure of the second read transistor (RPG) are both continuous structures.

3. The layout pattern according to claim 2, wherein the additional fin structure is a segmented structure.

4. The layout pattern according to claim 1, wherein the additional fin structure and each fin structure are arranged parallel to each other.

5. The layout pattern according to claim 1, wherein the gate structure of the second read transistor (RPG) is not connected to the gate structure of the first pass gate transistor (PG1).

6. The layout pattern according to claim 1, wherein the additional fin structure partially overlaps with the gate structure of the first pass gate transistor (PG1), and the additional fin structure does not overlap with the gate structure of the second read transistor (RPG).

7. The layout pattern according to claim 1, further comprising a plurality of patterned metal layers spanning each fin structure.

8. A forming method of layout pattern of static random access memory, comprising:
providing a substrate;
forming a plurality of fin structures located on the substrate;
forming a plurality of gate structures located on the substrate and span the fin structures to form a plurality of transistors on the substrate, wherein each transistor comprises a part of the gate structure spanning a part of the fin structure, and the plurality of transistors comprising:
a first pull-up transistor (PU1), a first pull-down transistor (PD1), a second pull-up transistor (PU2) and a second pull-down transistor (PD2) together constituting a latch circuit;
a first pass gate transistor (PG1) and a second pass gate transistor (PG2) connected to the latch circuit; and
a first read transistor (RPD) and a second read transistor (RPG) connected in series with each other, wherein the gate structure of the first read transistor (RPD) is connected with the gate structure of the first pull-down transistor (PD1); and
forming an additional fin structure located between the fin structure of the first pass gate transistor (PG1) and the fin structure of the second read transistor (RPG), wherein a length of the additional fin structure is shorter than a length of the fin structure.

9. The method according to claim 8, wherein the fin structure of the first pass gate transistor (PG1) and the fin structure of the second read transistor (RPG) are both continuous structures.

10. The method according to claim 9, wherein the additional fin structure is a segmented structure.

11. The method according to claim 8, wherein the additional fin structure and each fin structure are arranged parallel to each other.

12. The method according to claim 8, wherein the gate structure of the second read transistor (RPG) is not connected to the gate structure of the first pass gate transistor (PG1).

13. The method according to claim 8, wherein the additional fin structure partially overlaps with the gate structure of the first pass gate transistor (PG1), and the additional fin structure does not overlap with the gate structure of the second read transistor (RPG).

14. The method according to claim 8, further comprising forming a plurality of patterned metal layers spanning each fin structure.

15. A layout pattern of static random access memory, comprising:
a substrate;
a plurality of fin structures located on the substrate;
a plurality of gate structures located on the substrate and span the fin structures to form a plurality of transistors distributed on the substrate, wherein each transistor comprises a part of the gate structure spanning a part of the fin structure, and the plurality of transistors comprising:
a first pull-up transistor (PU1), a first pull-down transistor (PD1), a second pull-up transistor (PU2) and a second pull-down transistor (PD2) together constituting a latch circuit;
a first pass gate transistor (PG1A), a second pass gate transistor (PG1B), a third pass gate transistor (PG2A) and a fourth pass gate transistor (PG2B) connected to the latch circuit;
wherein the fin structures included in the first pull-down transistor (PD1), there is at least one extended fin structure, wherein the distance from the fin structure of the first pass gate transistor (PG1A) to the extended fin structure is equal to the distance from the fin structure of the second pass gate transistor (PG1B) to the extended fin structure.

16. The layout pattern according to claim 15, wherein at least one of the fin structures included in the first pull-down transistor (PD1) has a shorter fin structure, and the length of the shorter fin structure is smaller than that of the extended fin structure.

17. The layout pattern according to claim 15, wherein the fin structures included in the second pull-down transistor (PD2) have at least one second extended fin structure, and the distance from the fin structure of the third pass gate transistor (PG2A) to the second extended fin structure is equal to the distance from the fin structure of the fourth pass gate transistor (PG2B) to the second extended fin structure.

18. The layout pattern according to claim 15, wherein at least one of the fin structures included in the second pull-down transistor (PD2) has a shorter fin structure, and the length of the shorter fin structure is smaller than that of the second extended fin structure.

19. The layout pattern according to claim 15, wherein the SRAM is a 8T-dual port SRAM.

* * * * *